US008126684B2

(12) United States Patent
Goel et al.

(10) Patent No.: US 8,126,684 B2
(45) Date of Patent: Feb. 28, 2012

(54) TOPOLOGY OPTIMIZATION FOR DESIGNING ENGINEERING PRODUCT

(75) Inventors: Tushar Goel, Livermore, CA (US); Willem J. Roux, Livermore, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 441 days.

(21) Appl. No.: 12/422,149

(22) Filed: Apr. 10, 2009

(65) Prior Publication Data

US 2010/0262406 A1    Oct. 14, 2010

(51) Int. Cl.
*G06F 17/50*    (2006.01)
(52) U.S. Cl. .......................................................... 703/1
(58) Field of Classification Search ........................ 703/1
See application file for complete search history.

(56) References Cited

U.S. PATENT DOCUMENTS

| | | | |
|---|---|---|---|
| 2008/0300831 A1* | 12/2008 | Taggart et al. | 703/1 |
| 2009/0164178 A1* | 6/2009 | Pydimarry et al. | 703/1 |
| 2010/0058257 A1* | 3/2010 | Park | 716/2 |

OTHER PUBLICATIONS

Neal M. Patel et al., "Crashworthiness Design Using Topology Optimization," Jul. 2007, University of Notre Dame, pp. 1-173.*
Neal M. Patel et al., "Topology optimization for synthesizing extrusion based nonlinear transient designs," 2007, Proceedings of the ASME 2007 International Design Engineering Technical Conferences/Computers and Information in Engineering Conference, pp. 1-16.*
S.J. Lee et al., "Shell topology optimization using the layered artificial material model," 2000, International Journal for Numerical Methods in Engineering, vol. 47, pp. 843-867.*
J. Stegmann et al., "Discrete material optimization of general composite shell structures," 2005, International Journal for Numerical Methods in Engineering, vol. 62, pp. 2009-2027.*
T.E. Bruns et al., "An element removal and reintroduction strategy for the topology optimization of structures and compliant mechanisms," 2003, International Journal for Numerical Methods in Engineering, vol. 57, pp. 1413-1430.*
Shyue-Jian Wu et al., "Steady-state genetic algorithms for discrete optimization of trusses," 1995, Computer & Structures, vol. 56, No. 6, pp. 979-991.*
EPO Extended Search Report for Application Ser. No. 10155747.8-2224/2251805, Jun. 1, 2011.
Andres Tovar "Topology optimization using a hybrid cellular automaton method with local control rules" Journal of Mechanical Design, vol. 128, Nov. 2006, pp. 1205-1216, XP002637854.
Andres Tovar "Optimality conditions of the hybrid cellular automata for structural optimization", AIAA Journal, vol. 45, No. 3, Mar. 2007, pp. 673-683, XPS002637855.

(Continued)

*Primary Examiner* — Paul Rodriguez
*Assistant Examiner* — Russ Guill
(74) *Attorney, Agent, or Firm* — Roger H. Chu

(57) ABSTRACT

Improved topology optimization for engineering product design is disclosed. An engineering product including a design domain to be optimized is defined. Design domain can be a portion or the entire engineering product. Design objective and optional constraint are defined such that optimization goal is achieved. Additionally, initial configuration of the design domain is represented by a finite element analysis (FEA) mesh. Each element or element group is associated with a design variable. A set of discrete material models is created from the baseline material used for the design domain. The set of discrete material models is configured to cover entire range of the design variable and each discrete material model represents a non-overlapping portion. Each element representing the design domain is associated with an appropriate discrete material model according to the design variable. Structure response is obtained via FEA to evaluate design objective and update design variable.

18 Claims, 9 Drawing Sheets

OTHER PUBLICATIONS

Liangsheng Wang et al. "Automobile body reinforcement by finite element optimization", Finite Elements in Analysis and Design, May 2004, pp. 879-893, XPS002637856.

Bendose et al. "Material Interpolation schemes in topololgy optimization", Archive of Applied Mechanics, Nov. 1999, pp. 635-654, XPS004190050248.

* cited by examiner

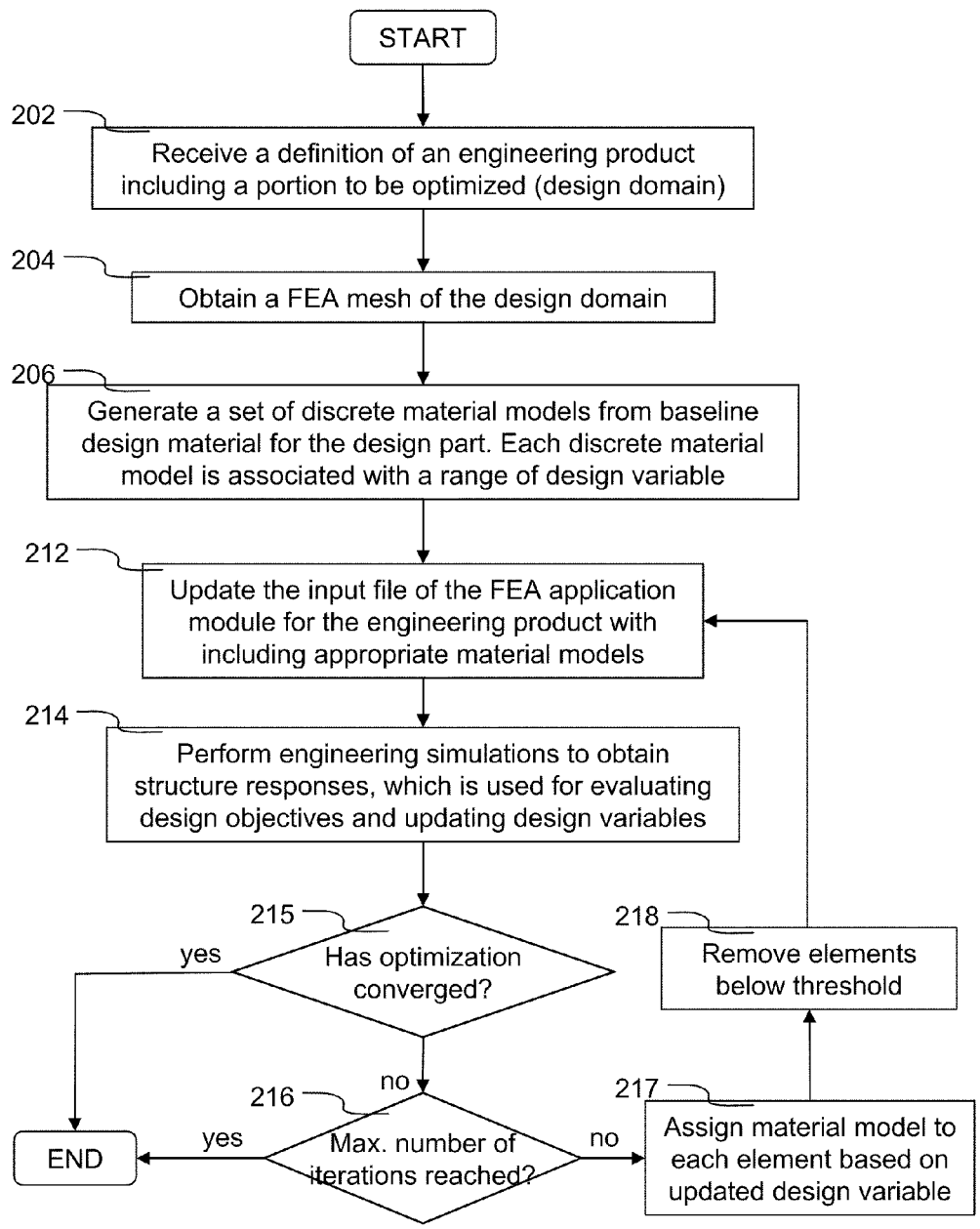

TOPOLOGY OPTIMIZATION FOR DESIGNING ENGINEERING PRODUCT

FIELD OF THE INVENTION

The present invention generally relates to computer aided engineering design optimization, more particularly to methods and systems for providing efficient and effective topology optimization in engineering product design.

BACKGROUND OF THE INVENTION

Today, computer aided engineering (CAE) has been used for supporting engineers in tasks such as analysis, simulation, design, manufacture, etc. In a conventional engineering design procedure, CAE analysis (e.g., finite element analysis (FEA), finite difference analysis, meshless analysis, computational fluid dynamics (CFD) analysis, modal analysis for reducing noise-vibration-harshness (NVH), etc.) has been employed to evaluate responses (e.g., stresses, displacements, etc.). Using automobile design as an example, a particular version or design of a car is analyzed using FEA to obtain the responses due to certain loading conditions. Engineers will then try to improve the car design by modifying certain parameters or design variables (e.g., thickness of the steel shell, locations of the frames, etc.) based on specific objectives and constraints. Another FEA is conducted to reflect these changes until a "best" design has been achieved. However, this approach generally depends on knowledge of the engineers or based on a trial-and-error method. To solve this problem, a systematic approach (referred to as design optimization) to identify the "best" design is used.

Traditionally, design optimization is performed with a computer system and generally divided into three categories, sizing, shape and topology. Topology optimization is best suited for creating optimal conceptual design in which the user (i.e., engineer, designer, etc.) does not have put too many constraints as to the shape and/or size of the engineering product. However, there are problems associated with topology optimization especially for the topology optimization of a component of a complex structure, where the structure responses of the complex structure or engineering product is calculated using a finite element analysis (FEA). In particular, the design variable in the topology optimization is a continuous real number, which is associated with material models in the FEA model. Difficulties for handling infinite possibilities of material models include very long, expensive and infeasible procedure to perform topology optimization. As a result, only relatively simple or simplified complex structure can be optimized using prior art approaches in topology optimization. Therefore, it would be desirable to have improved methods and systems for performing topology optimization for designing an engineering product.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

The present invention discloses methods and systems for improved topology optimization for engineering product design. According to one aspect of the present invention, an engineering product including a design domain to be optimized is defined. The design domain can be a portion of or the entire engineering product. At least one design objective is defined such that the optimization goal can be achieved. One or more optional design constraints can also be defined in conjunction with the design objective. Additionally, the initial configuration of the design domain is represented by a finite element analysis mesh or a plurality of finite elements in a grid. Each element is associated with a design variable. A set of discrete material models are created from the baseline material used for the design domain or part. Each of the discrete material models represents a particular non-overlapping range of the design variable. The set of discrete material models is configured to limit the infinite nature of the design variable to a finite number of material models According to another aspect, iterative topology optimization starts with an initial configuration of the design domain. In each iteration, at least one computer aided engineering simulation is performed to evaluate structure response of the entire engineering product under respective loading conditions. The engineering simulation is conducted using a finite element analysis in a computer system with the FEA application module installed thereon. Relevant information of each element is extracted from the FEA results or structure responses. Design objectives (sometimes objective functions) and optional constraints are then calculated using the appropriate formulations. Design variable for each element can then be updated from the calculated design objectives and optional constraints. Appropriate discrete material model is assigned to each element in accordance with the discretization mechanism. An overall convergence is checked. If it is determined the convergence has not been reached, another iteration of the topology optimization is carried out. In the new iteration, updated material model is used in the design domain. Those elements assigned with a discrete material model corresponding to design variable below a threshold are removed from the FEA mesh. The iterative optimization continues until the overall convergence criterion has been met or a predetermined maximum number of iterations have been reached.

According to yet another aspect, iterative topology optimization is based on a hybrid cellular automata (HCA) method having a number of lattices. Each lattice is mapped to one or more of the elements or the finite element analysis grid representing the design domain. A list of neighboring elements or lattices is determined for each lattice, which is used for substantially reducing or limiting numerical discontinuity between two adjacent lattices and evolving the optimal topology. The lattice-element mapping relationship allows the design objectives and optional constraints be calculated in an engineering simulation, while the HCA based topology optimization is performed on the lattices.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 2A-2B collectively is a flowchart illustrating an exemplary process of performing topology optimization for an engineering product using finite element analysis and hybrid cellular automata to evaluate design objectives and optional constraints, according to an embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Additionally, the term "optimal design" in this document is intended to indicate a design that meets the design requirements (e.g., goal, objective and constraint) in an iterative optimization design process. Furthermore, the terms "optimal design", "substantially improved design", "significantly improved design" and "final design" are used interchangeably throughout this document. Finally, the order of blocks in process flowcharts or diagrams representing one or more embodiments of the invention do not inherently indicate any particular order nor imply any limitations in the invention.

Embodiments of the present invention are discussed herein with reference to FIGS. 1A-6. However, those skilled in the art will readily appreciate that the detailed description given herein with respect to these figures is for explanatory purposes as the invention extends beyond these limited embodiments.

Figure 1A:
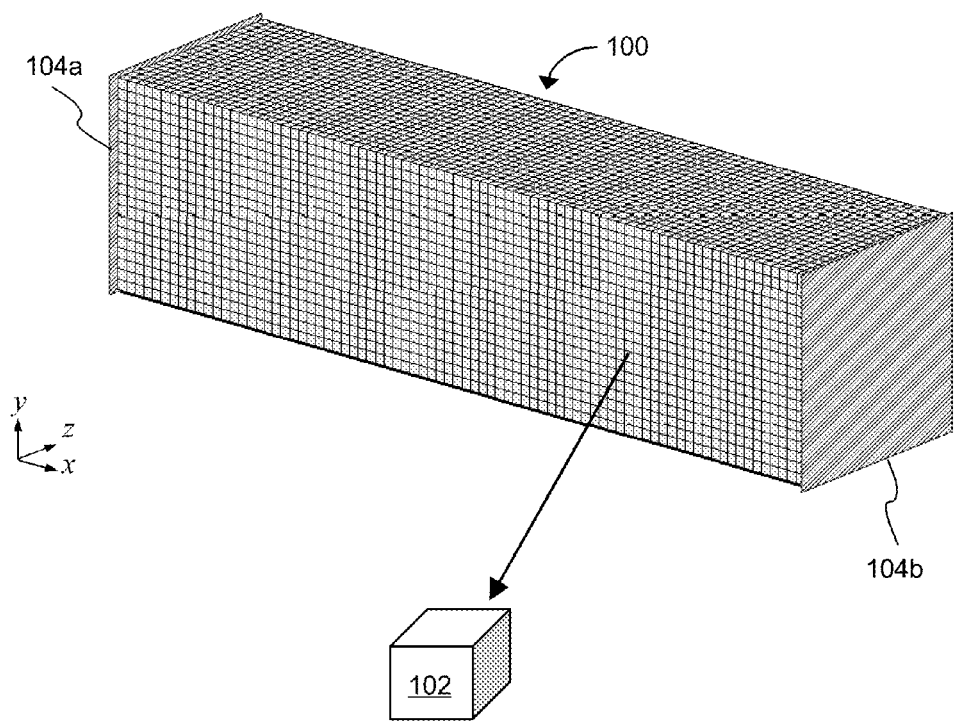
FIG. 1A is a perspective view showing an exemplary design domain represented by a plurality of finite elements in a finite element mesh to be used in a topology optimization, according to an embodiment of the present invention.
Figure 1B:
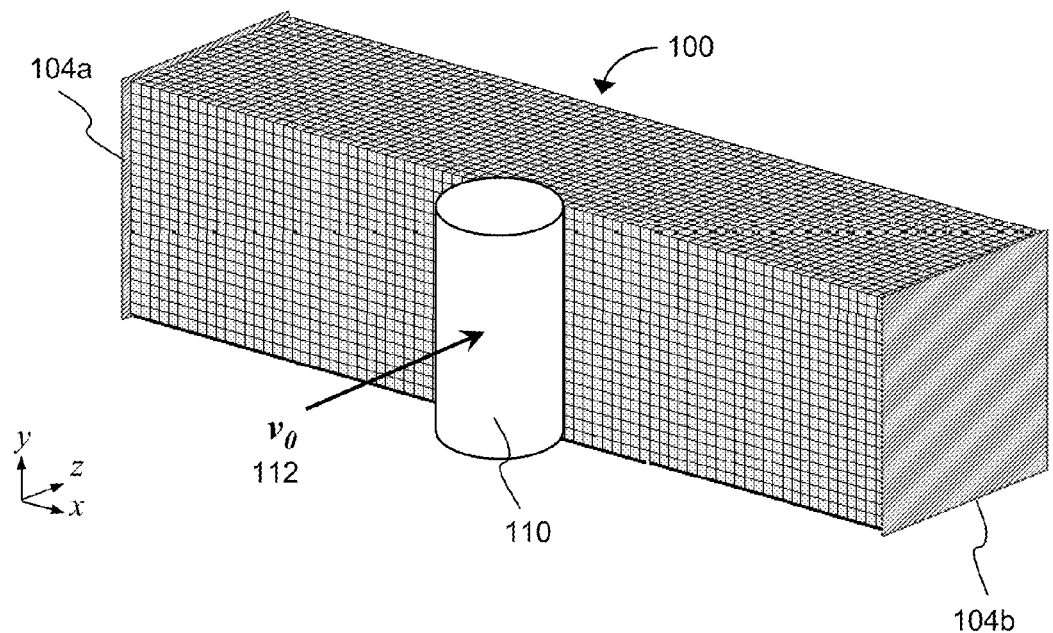
FIG. 1B is a perspective view showing the design domain of FIG. 1A under a design loading condition.
Figure 1C:
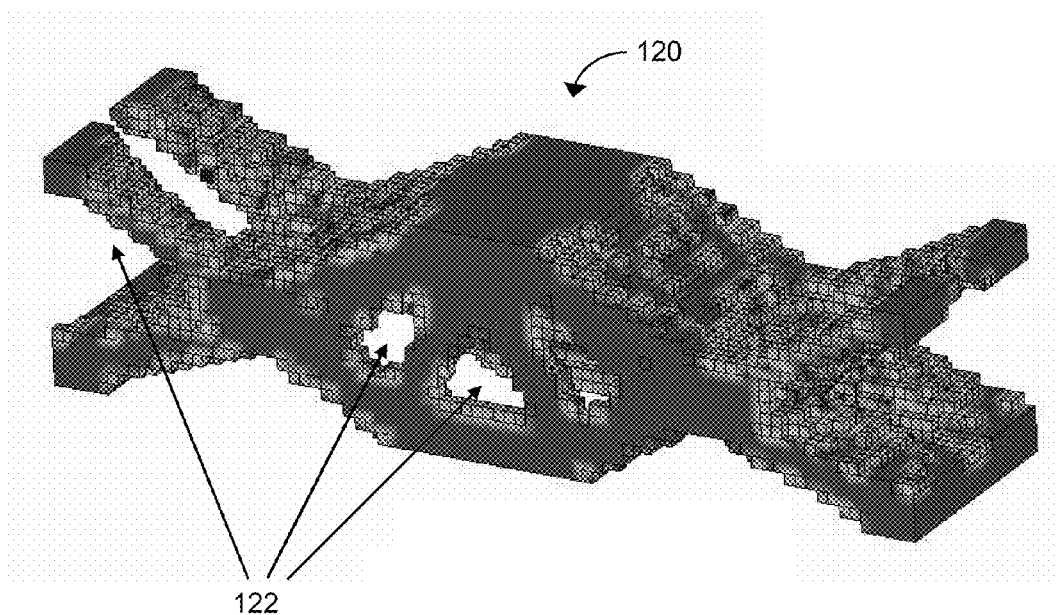
FIG. 1C is a perspective view showing an exemplary optimal design of the design domain of FIG. 1A under the loading condition shown in FIG. 1B.

Referring first of FIG. 1A, a beam or design domain 100 is represented by a plurality of finite elements 102 with both ends 104a-b fixed. The beam 100 under a loading condition is shown in FIG. 1B. The loading condition is represented by a cylinder 110 (shown as an open half circular plate for easier viewing) with an initial velocity ($v_o$) 112 contacting the beam in between two fixed ends 104a-b. Shown in FIG. 1C is an optimal design 120 of the beam 100 under the loading condition of FIG. 1B. Some of the elements 102 have been removed (shown as empty space 122) as a result of a topology optimization.

Those of ordinary skill in the art would know such a beam (design domain) 100 is generally a simplification of a structural component in a more complex structure (not shown). According to one aspect of the present invention, the beam 100 can be optimized with an iterative topology optimization using a finite element analysis application module to perform one or more engineering simulations of the entire structure. Furthermore, while the finite elements 102 shown herein are three-dimensional solid continuum elements, other type of finite elements can be used in the iterative topology optimization, for example, shell elements. According to one embodiment of the present invention, an exemplary process 200 of performing hybrid cellular automata (HCA) based topology optimization of an engineering product using finite element analysis is shown collectively in FIGS. 2A-B. Process 200 is preferably implemented in software.

At the onset, process 200 receives a definition of an engineering product including a design domain to be optimized at step 202. The design domain can be a portion of engineering product or sometimes the entire product. In one example, the engineering product comprises a car while the design domain is the bumper of the car. In another, the beam 100 of FIGS. 1A-1C is the engineering product and the design domain.

Also included in the definition are one or more design optimization goals or objectives, and optional design constraints, for example, achieving a minimum weight while maintaining structure integrity/strength to meet the industry and/or government rules and regulations. A baseline material for the design domain is specified in the definition.

At step 204, process 200 obtains a finite element analysis (FEA) mesh of the design domain. The FEA mesh generally comprises a plurality of finite elements in a grid. In a three-dimensional engineering product, each element is generally represented a solid continuum element (e.g., element 102) that is associated with a material or mass density. Next, at step 206, a set of discrete material models is created from the baseline material for the design domain. In an iterative topology optimization, each element is assigned a design variable, which is a continuous real number ranging from zero to one. Each of the discrete material models 420 corresponds to a portion of the design variable 410 shown in FIG. 4. For example, material model $m_0$ is associated with design variable between zero(0) and a threshold number substantially close to zero, material model $m_1$ a different range, and so on. Finally, there is a material model $m_n$ corresponding to the baseline material, which is substantially close to the design variable one (1). While the exemplary design variable 410 has a range between zero and one, those of ordinary skill in the art understand other ranges can be used instead.

In order to perform optimization, a material model that relates the design variable to material properties must be established. One exemplary material model that can be used is referred to as Solid Isotropic Material with Penalization (SIMP) model, for example, a SIMP model relates the material properties and the design variables as follows:

Mass density $\rho_i = X_i \rho_o$

Young's Modulus $E_i = (X_i)^p E_o$

Yield Stress $YS_i = (X_i)^q YS_o$

Strain Hardening $ES_i = (X_i)^q ES_o$

Figure 5:
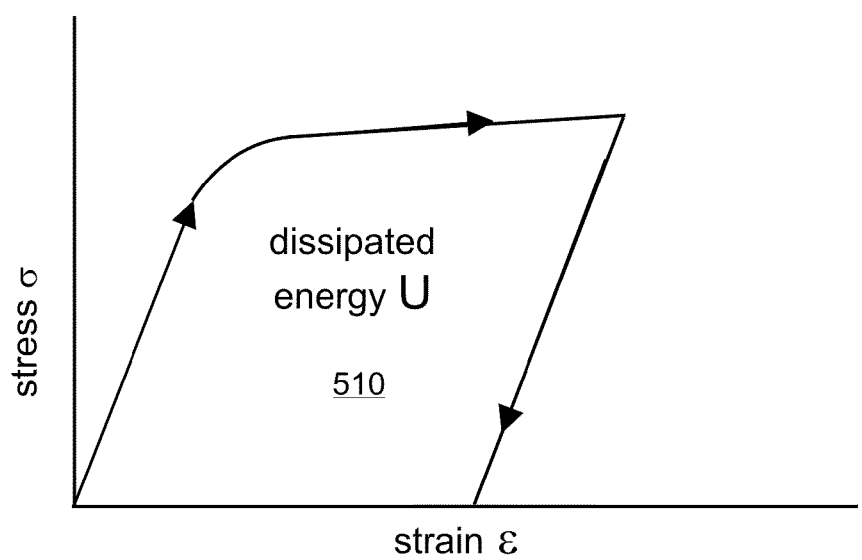
FIG. 5 is a diagram showing a diagram showing material energy dissipation that can be used as measurement of an exemplary design objective, according to an embodiment of the present invention.

Material properties with subscript "o" are of the baseline material, while properties with subscript "i" represent material corresponded to design variable "$X_i$". Constants "p" and "q" are parameters used for calibrating the material properties to the numerical formula. Using the exemplary SIMP model, a set of discrete material models can be established. FIG. 5 is a diagram showing the strain-stress relationship of a material, which can be characterized by a SIMP model.

Next at step 212, process 200 creates an input file for the FEA application module to conduct one or more engineering simulations of the engineering product. Each simulation can be associated with one loading condition. Some designs require multiple loading conditions, for example, front and oblique impacts of a car. The design domain portion of the input file is subjected to change in the optimization procedure because material model assigned to each element of the design domain changes with the design variable. In one embodiment, the input file of the engineering product is split into two parts: a static portion that is not altered in the optimization and a dynamic portion that is modified at the end of each iteration. For topology optimization, the appropriate discrete material model is assigned to all of the finite elements representing the design domain initially. In subsequent iterations, respective appropriate discrete material model, according to the updated design variable, is assigned to each of the finite elements. At step 214, the entire structure including the design domain or part is evaluated using finite element analysis and design variables are updated using a HCA based method. Details of step 214 are shown in FIG. 2B and corresponding descriptions below.

Process 200 moves to decision 215, in which it is determined whether the optimization has converged. A criterion covering the entire design domain is generally used for the decision 215, for example, averaged change of all of the elements in the design domain is used for determining whether the optimization has converged from the previous iteration. If 'yes', process 200 ends.

Otherwise, process 200 moves to another decision 216 to determine whether a predetermined maximum number of iterations allowed have reached. If 'yes', the process 200 ends. If 'no', process 200 assigns appropriate discrete material model to each element according to updated design variable at step 217 and removes those elements having a design variable below a predefined threshold at step 218. Process 200 then moves back to step 212 generating another input file that reflects updated design domain (i.e., different material for the remaining elements) to perform another iteration of the topology optimization until either decision 215 becomes 'yes' or the number of iterations exceed the maximum number of iterations allowed. Process 200 ends with a design that meets the design goal of the optimization (i.e., an optimal design or a significantly or substantially improved design).

Figure 2B:
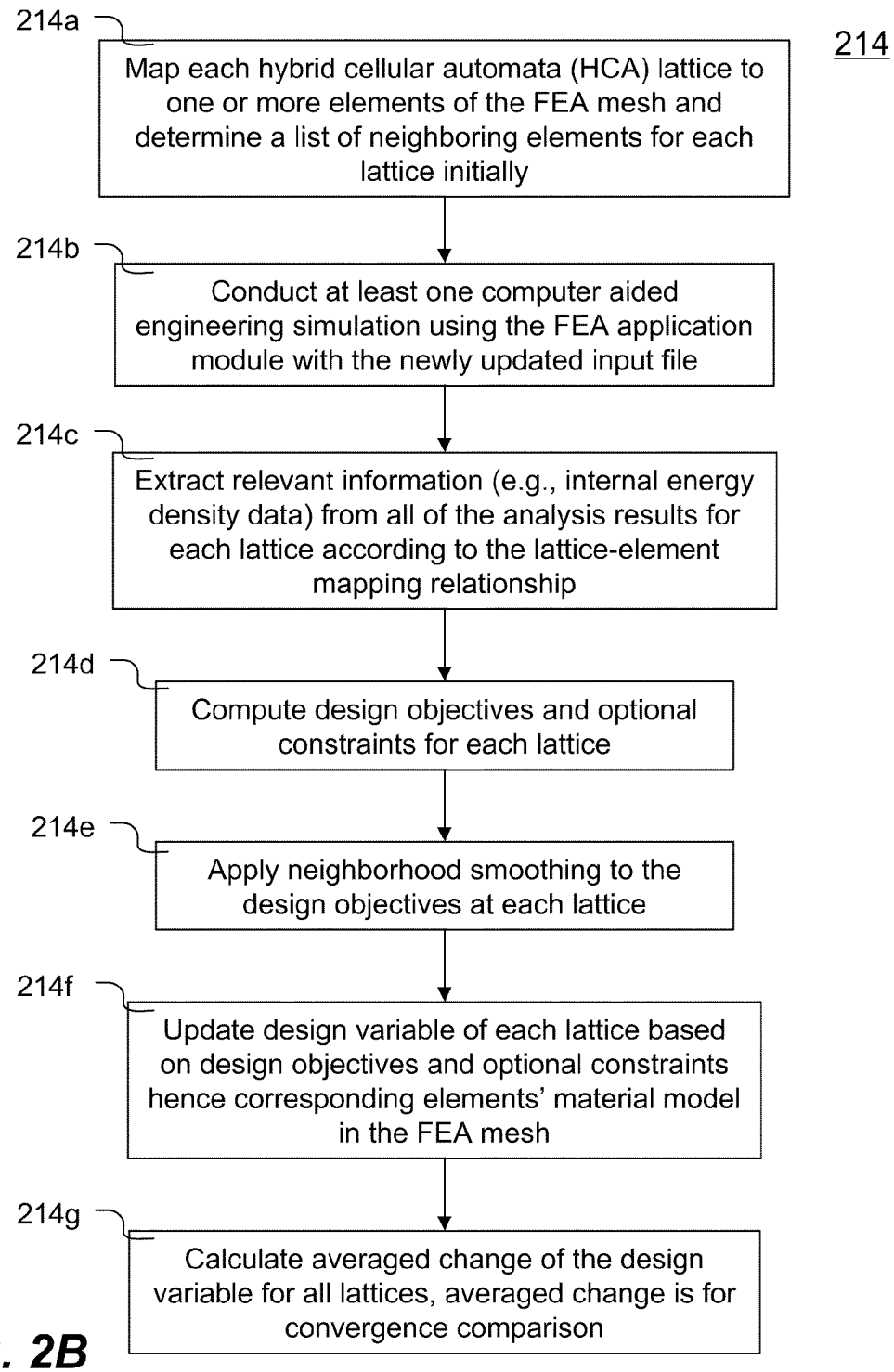

FIG. 2B is a flowchart showing details of step 214 of the process 200. Step 214 comprises an exemplary process of evaluating design and updating the design variables using a HCA based method, which uses finite element analysis to obtain responses of the entire engineering product under one or more loading conditions.

Figure 3A:
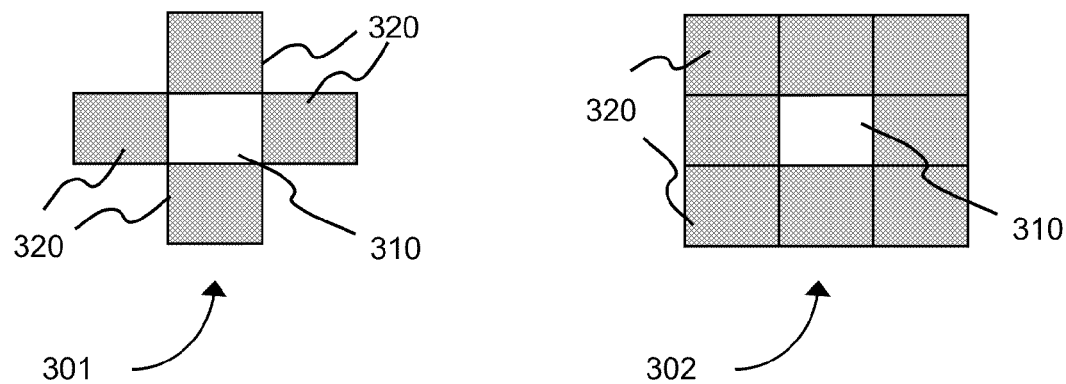
FIG. 3A is a diagram illustrating two exemplary schemes for designating or defining a neighborhood of a two-dimensional element.
Figure 3B:
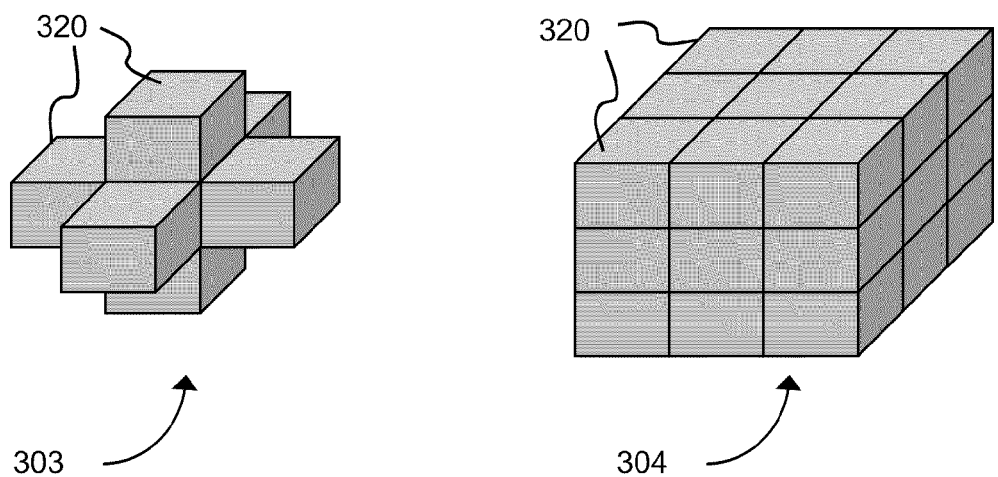
FIG. 3B is a diagram illustrating two exemplary schemes for designating or defining a neighborhood of a three-dimensional element.

Step 214 of the process 200 starts at step 214a, each element of the FEA mesh is mapped to HCA lattice. The mapping is configured to associate at least one element to each lattice, then a neighborhood for each lattice is determined. The neighborhood can be represented by a list of neighboring elements. FIGS. 3A and 3B are diagrams showing exemplary neighborhood definition graphically in two- and three-dimension, respectively. Each lattice (i.e., element 310 (not shown in FIG. 3B)) has a number of neighboring elements 320. A definition of a neighborhood can be set by various rules, for example, sharing at least one edge 301, at least one corner or node 302-304, or at least one face or side 303. The neighborhood information is used in the HCA based topology optimization to eliminate or minimize discontinuity. It is noted that step 214a may only need to be performed once initially, since the mapping relationship and neighborhood definition can be static or unchanged throughout the HCA method.

Figure 3C:
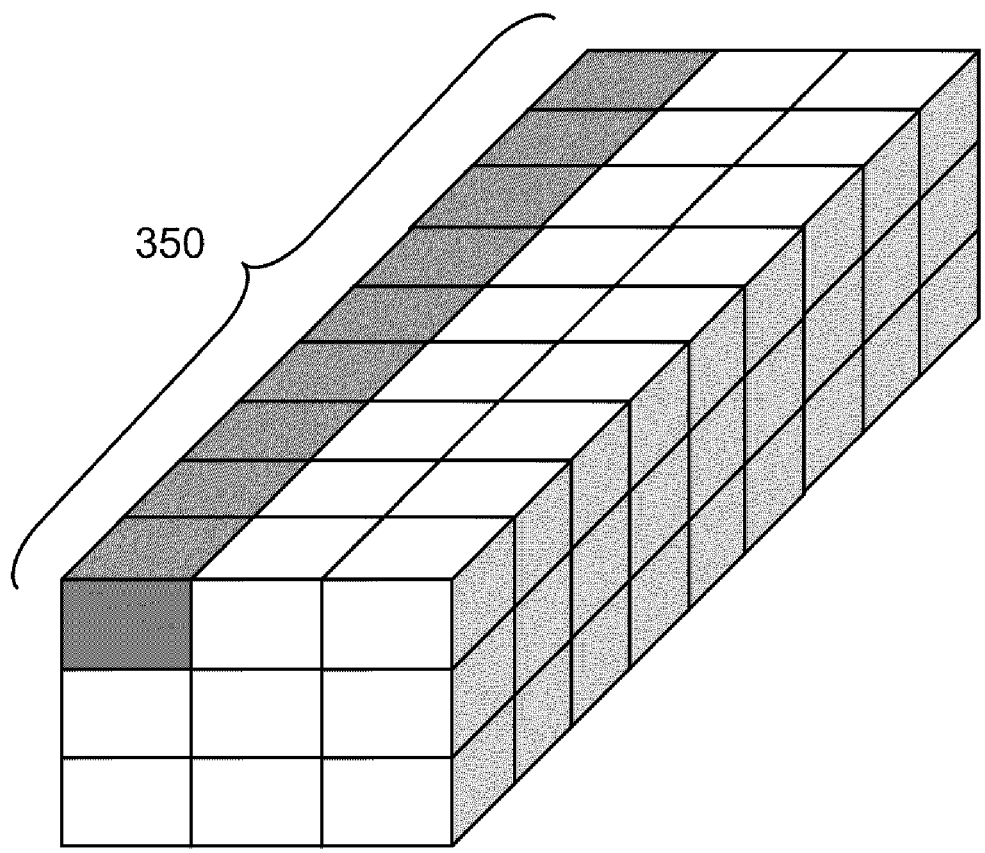
FIG. 3C is a diagram showing an exemplary mapping scheme to convert a three-dimensional design domain to a two-dimension cross-section, according to an embodiment of the invention.
Figure 4:
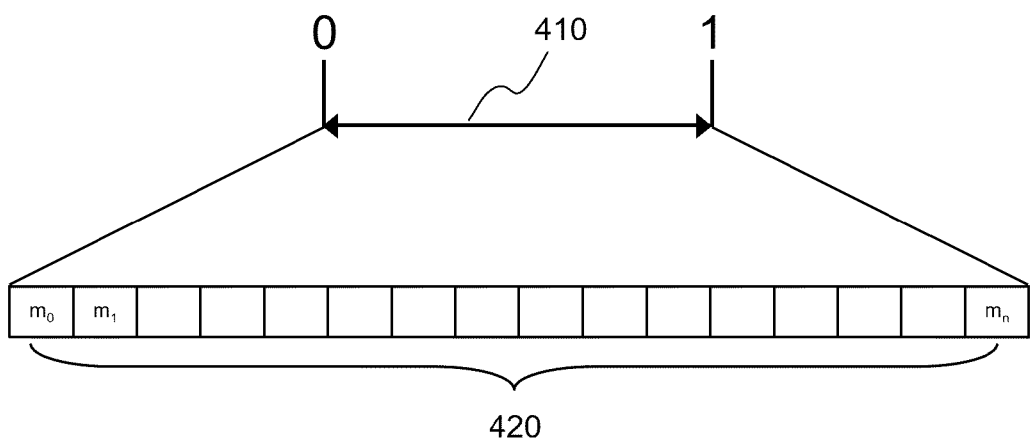
FIG. 4 is a diagram showing an exemplary scheme used for discretizing a continuous design variable in accordance with one embodiment of the present invention.

According to another aspect, each HCA lattice can be configured to group a column of elements 350 shown in FIG. 3C. Such mapping converts a three-dimension domain to a two-dimension cross-section, which is optimized.

Then at step 214b, at least one computer aided engineering simulation, which is a finite element analysis (FEA) of the engineering product under one or more load conditions. The FEA is performed in a computer system with the FEA application module installed thereon. The input file updated or created in step 212 is used for numerically representing the intermediate engineering product, which evolves from the initial design to the optimal design. Each element in the finite element mesh representing the design domain is assigned with one of the discrete material models according to the associated design variable.

Next, at step 214c, relevant information is extracted from the FEA results, for example, internal energy of each element (e.g., dissipated energy or area 510 under the stress-strain curve of FIG. 5) in the design domain. Based on the mapping between the HCA lattices and the finite elements, the extracted information is assigned to respective lattices. The mapping relationship can be a one-to-one or many elements to one lattice. Once the extracted information is assigned, design objectives and optional constraints are computed at step 214d for each lattice. In one embodiment, the design objective of a lattice is calculated by a weighted sum of the relevant information for all load conditions. In another embodiment, the design objective is calculated as a moving average of the relevant information from several previous iterations of the topology optimization.

At step 214e, a neighborhood smoothing operation is performed to reduce or limit discontinuity between two adjacent lattices and evolve the design. Using the neighborhood definition, each lattice in the design domain has a list of neighboring lattices. A number of known methods can be implemented to accomplish the neighborhood smoothing operation, for example, a simple average of all calculated design objectives in the neighborhood, or a weighted average.

Once the design objectives and optional constraints have been calculated for each lattice, the design variable associated with each of the elements can be updated at step 214f. Depending upon the design optimization goal, a specific correlation between the design variable and the design objectives and optional constraints can be used to update design variables. For example, one design goal is to have an optimal structure of the design domain at a particular weight limit under certain load conditions. In order to achieve the design goal, the optimal design should comprise a structure that can absorb energy most efficiently and does not exceed the constraint (i.e., weight limit). This may be achieved by a structure having a substantially uniform internal energy under the design conditions.

A numerical quantity for determining convergence of the HCA based topology optimization is calculated at step 214g. The numerical quantity is preferably an averaged design objective change between consecutive iterations, for example, average design objective change of all elements in the design domain. The step 214 ends thereafter. Alternatively, termination of step 214 can also be controlled by other known techniques, for example, a maximum number of iterations allowed in an optimization. The optimization would terminate when the maximum has been reached, even though the convergence criterion may not have been achieved.

Figure 6:
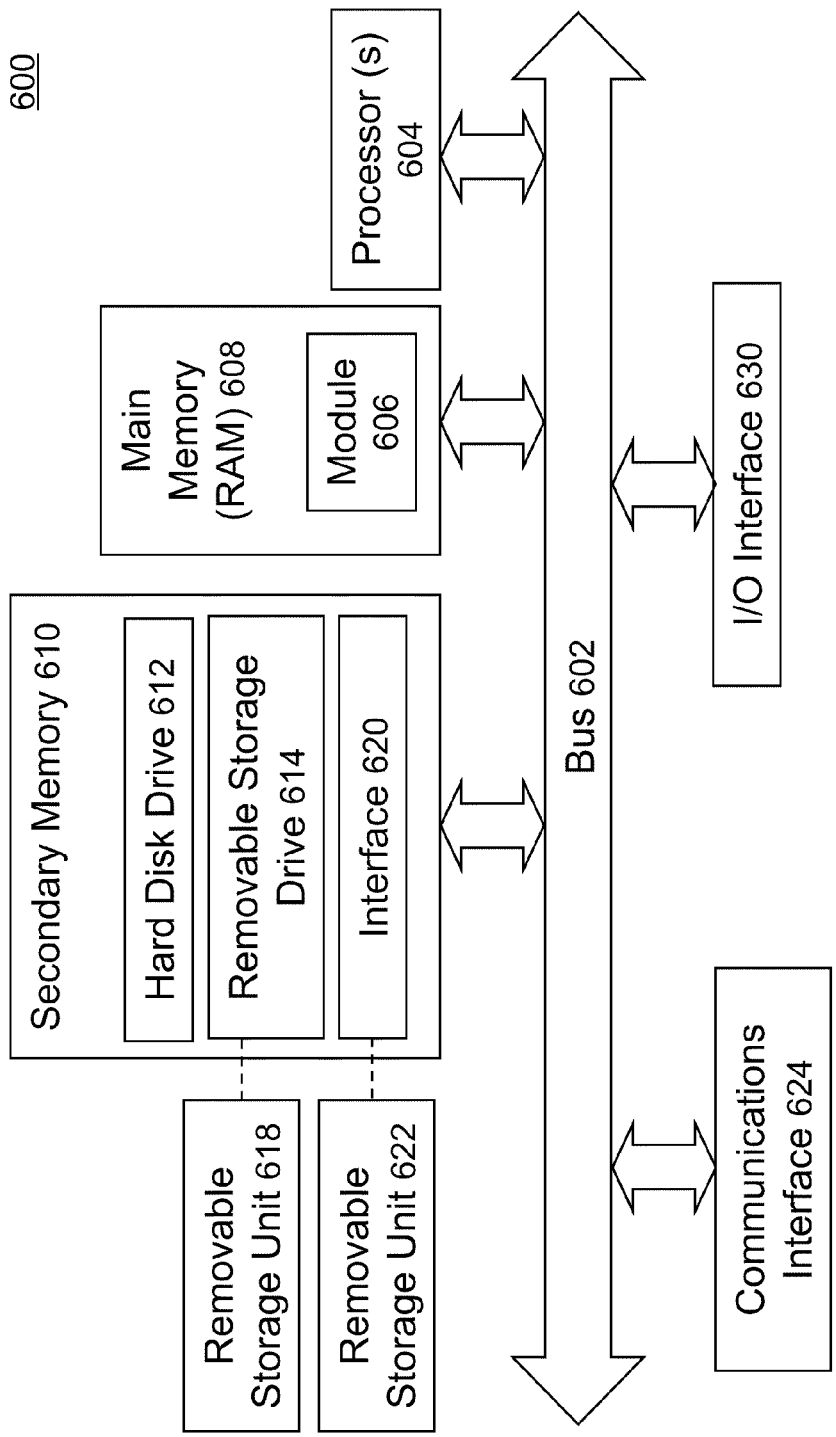
FIG. 6 is a function diagram showing salient components of a computing device, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data transferred via communications interface 624 are in the form of signals which may be electronic, electromagnetic, optical, or other signals capable of being received by communications interface 624. The computer 600 communicates with other computing devices over a data network based on a special set of rules (i.e., a protocol). One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600. In this document, the terms "computer program medium" and "computer usable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with one or more application modules 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). The status of the CAE analysis or design optimization (e.g., configuration at the end of each iteration) is reported to the user via the I/O interface 630 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the number of design objectives and variables has been shown as two, in reality, a larger number of design objectives and variables have been used. The number of design constraints can also be high. Furthermore, whereas finite element analysis has been described and shown for obtaining the structure responses, other types of CAE analysis such as finite difference analysis or meshless analysis, etc. may be used to achieve the same. Furthermore, whereas the internal energy absorption capability has been shown and described as design objective, other types of design objectives may be used, for example, maximum stress, maximum displacement, etc. While the methodology is demonstrated for the hybrid cellular automaton based topology optimization algorithm, it can be used with other topology optimization algorithms, e.g. equivalent static load method also. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of obtaining an optimal design of an engineering product in a topology optimization comprising:
   receiving, in a computer system, a definition of an engineering product including a designated design domain to be optimized in accordance with at least one design objective, the definition includes a finite element analysis (FEA) grid of the design domain and a baseline material to be used for the design domain, wherein the FEA grid comprises a plurality of finite elements each assigned a design variable, which corresponds to the baseline material's properties;
   deriving a plurality of discrete material models each configured for representing a specific fraction of the baseline material, wherein the specific fraction is associated with a corresponding portion of the range of the design variable; and
   obtaining an optimal design of the design domain that achieves said at least one design objective by iteratively modifying some of the elements according to changes of the respective design variable in an iterative topology optimization of the design domain, wherein each iteration of the topology optimization comprises performing at least one engineering simulation in the computer system using finite element analysis of the engineering product and evaluating results obtained from said at least one design objective from said at least one engineering simulation to update the respective design variable of each of the elements, said each of the elements is assigned a corresponding one of the discrete material models according to the respective design variable in said each iteration, and one or more of the elements having said respective design variable below a predefined threshold are removed at the end of said each iteration.

2. The method of claim 1, wherein the designated design domain comprises a portion of the engineering product.

3. The method of claim 1, wherein the plurality of the discrete material models is configured to cover the design variable's range.

4. The method of claim 3, wherein each of the plurality of the discrete material models represents a distinct non-overlapping portion of the design variable's range.

5. The method of claim 1, wherein the iterative topology optimization is a hybrid cellular automata (HCA) based topology optimization, which contains a plurality of HCA lattices each associated with at least one of the finite elements.

6. The method of claim 5, wherein the HCA based topology optimization further includes determining a list of neighboring elements for said each of the lattices in accordance with a set of neighborhood determination rules configured for a design objective smoothing procedure for reducing discontinuity in the optimal design.

7. The method of claim 5, wherein said at least one design objective includes maximizing internal energy absorbing of said each of the finite elements by keeping a predetermined total weight or mass of the design domain.

8. The method of claim 1, wherein the predefined threshold is a limit for element removal.

9. The method of claim 1, wherein said at least one engineering simulation includes simulating one or more loading conditions under which the engineering product is designed and optimized.

10. The method of claim 1, wherein the optimal design is achieved when a predefined convergence condition has been determined between two consecutive iterations of the topology optimization, wherein the predefined convergence condition is defined as a substantially small difference with respect to said design domain.

11. The method of claim 1, wherein the optimal design is achieved when a predetermined maximum number of iterations have been reached in the topology optimization.

12. A system for obtaining an optimal design of an engineering product in a topology optimization comprising:
    a main memory for storing computer readable code for an application module;
    at least one processor coupled to the main memory, said at least one processor executing the computer readable code in the main memory to cause the application module to perform operations by a method of:
    receiving a definition of an engineering product including a designated design domain to be optimized in accordance with at least one design objective, the definition includes a finite element analysis (FEA) grid of the design domain and a baseline material to be used for the design domain, wherein the FEA grid comprises a plurality of finite elements each assigned a design variable, which corresponds to the baseline material's properties;
    deriving a plurality of discrete material models each configured for representing a specific fraction of the baseline material, wherein the specific fraction is associated with a corresponding portion of the range of the design variable; and
    obtaining an optimal design of the design domain that achieves said at least one design objective by iteratively modifying some of the elements according to changes of the respective design variable in an iterative topology optimization of the design domain, wherein each iteration of the topology optimization comprises performing at least one engineering simulation using finite element analysis of the engineering product and evaluating results obtained from said at least one design objective from said at least one engineering simulation to update the respective design variable of each of the elements, said each of the elements is assigned a corresponding one of the discrete material models according to the respective design variable in said each iteration, and one or more of the elements having said respective design variable below a predefined threshold are removed at the end of said each iteration.

13. The system of claim 12, wherein the iterative topology optimization is a hybrid cellular automata (HCA) based topology optimization, which contains a plurality of HCA lattices each associated with at least one of the finite elements.

14. The system of claim 13, wherein the HCA based topology optimization further includes determining a list of neighboring elements for said each of the lattices in accordance with a set of neighborhood determination rules configured for a design objective smoothing procedure for reducing discontinuity in the optimal design.

15. The system of claim 13, wherein said at least one design objective includes maximizing internal energy absorbing of said each of the finite elements by keeping a predetermined total weight or mass of the design domain.

16. A non-transitory computer-readable storage medium containing instructions for controlling a computer system for obtaining an optimal design of an engineering product in a topology optimization by a method comprising:

receiving, in a computer system, a definition of an engineering product including a designated design domain to be optimized in accordance with at least one design objective, the definition includes a finite element analysis (FEA) grid of the design domain and a baseline material to be used for the design domain, wherein the FEA grid comprises a plurality of finite elements each assigned a design variable, which corresponds to the baseline material's properties;

deriving a plurality of discrete material models each configured for representing a specific fraction of the baseline material, wherein the specific fraction is associated with a corresponding portion of the range of the design variable; and obtaining an optimal design of the design domain that achieves said at least one design objective by iteratively modifying some of the elements according to changes of the respective design variable in an iterative topology optimization of the design domain, wherein each iteration of the topology optimization comprises performing at least one engineering simulation in the computer system using finite element analysis of the engineering product and evaluating said at least one design objective from results obtained from said at least one engineering simulation to update the respective design variable of each of the elements, said each of the elements is assigned a corresponding one of the discrete material models according to the respective design variable in said each iteration, and one or more of the elements having said respective design variable below a predefined threshold are removed at the end of said each iteration.

17. The non-transitory computer-readable storage medium of claim 16, wherein the plurality of the discrete material models is configured to cover the entire range of the design variable.

18. The non-transitory computer-readable storage medium of claim 17, wherein the plurality of the discrete material models comprises first and second discrete material models representing respective portions of the range of the design variable, wherein the respective portions are distinct and non-overlapping.

\* \* \* \* \*